(12) United States Patent
Miao et al.

(10) Patent No.: US 11,955,491 B2
(45) Date of Patent: Apr. 9, 2024

(54) ARRAY SUBSTRATE AND MANUFACTURING METHOD THEREOF, MOTHERBOARD AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yingmeng Miao, Beijing (CN); Yinshu Zhang, Beijing (CN); Zhihua Sun, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 924 days.

(21) Appl. No.: 16/965,739

(22) PCT Filed: Sep. 29, 2019

(86) PCT No.: PCT/CN2019/109103
§ 371 (c)(1),
(2) Date: Jul. 29, 2020

(87) PCT Pub. No.: WO2021/056549
PCT Pub. Date: Apr. 1, 2021

(65) Prior Publication Data
US 2022/0384488 A1 Dec. 1, 2022

(51) Int. Cl.
*H01L 31/00* (2006.01)
*G02F 1/1333* (2006.01)
(Continued)

(52) U.S. Cl.
CPC ...... *H01L 27/124* (2013.01); *G02F 1/133351* (2013.01); *G02F 1/134309* (2013.01);
(Continued)

(58) Field of Classification Search
CPC ............... H01L 27/124; H01L 27/1292; G02F 1/133351; G02F 1/134309;
(Continued)

(56) References Cited

U.S. PATENT DOCUMENTS 9,379,031 B2 6/2016 Lee
2005/0195338 A1* 9/2005 Matsumoto ....... G02F 1/136204
349/40

(Continued)

FOREIGN PATENT DOCUMENTS

CN 102681224 9/2012
CN 104681581 6/2015
(Continued)

*Primary Examiner* — Samuel Park
(74) *Attorney, Agent, or Firm* — Leason Ellis LLP

(57) ABSTRACT

An array substrate and a manufacturing method thereof, a motherboard and a display device are disclosed. The array substrate has a display region and a non-display region, and includes a base substrate, and a plurality of signal lines and at least one transfer electrode that are on the base substrate. The plurality of signal lines extend from the display region to the non-display region along a first direction, at least one of the plurality of signal lines includes a first trace in the display region and a second trace in the non-display region, the second trace includes at least two sub-traces disconnected from each other, a sub-trace, close to the display region, of the at least two sub-traces of the second trace is directly connected with the first trace, and every two adjacent sub-traces of the second trace are electrically connected with each other.

16 Claims, 8 Drawing Sheets

(51) Int. Cl.
G02F 1/1343 (2006.01)
G02F 1/1362 (2006.01)
G02F 1/1368 (2006.01)
H01L 27/12 (2006.01)
G02F 1/1345 (2006.01)

(52) U.S. Cl.
CPC .. G02F 1/136227 (2013.01); G02F 1/136286 (2013.01); G02F 1/1368 (2013.01); H01L 27/1292 (2013.01); G02F 1/13452 (2013.01)

(58) Field of Classification Search
CPC ......... G02F 1/136227; G02F 1/136286; G02F 1/1368; G02F 1/13452; G02F 1/136254
See application file for complete search history.

(56) References Cited

U.S. PATENT DOCUMENTS

| | | | | |
|---|---|---|---|---|
| 2006/0146274 | A1* | 7/2006 | Youn | G02F 1/13458 349/192 |
| 2019/0171075 | A1* | 6/2019 | Yoshida | G02F 1/136259 |

FOREIGN PATENT DOCUMENTS

| | | |
|---|---|---|
| CN | 106597713 | 4/2017 |
| CN | 110286532 | 9/2019 |
| WO | 2018205730 | 12/2018 |

\* cited by examiner

ARRAY SUBSTRATE AND MANUFACTURING METHOD THEREOF, MOTHERBOARD AND DISPLAY DEVICE

CROSS-REFERENCE TO RELATED PATENT APPLICATIONS

This application is a U.S. National Stage Application under 35 U.S.C. § 371 of International Patent Application No. PCT/CN2019/109103, filed Sep. 29, 2019, which is incorporated by reference in its entirety.

TECHNICAL FIELD

Embodiments of the present disclosure relate to an array substrate and a manufacturing method thereof, a motherboard and a display device.

BACKGROUND

Signal lines in an array substrate are generally configured to provide electrical signals to a plurality of pixel units in a display region. For example, gate lines are configured to provide scanning signals to the plurality of pixel units in the display region. In a process of manufacturing the array substrate, a large amount of charges may be accumulated on the gate line, and in the case that the gate line encounters a trace with a large bending during extending, an arching phenomenon may occur, which may burn the gate line and cause defects such as breakage.

SUMMARY

At least one embodiment of the present disclosure provides an array substrate, the array substrate has a display region and a non-display region, and comprises a base substrate, and a plurality of signal lines and at least one transfer electrode that are on the base substrate. The plurality of signal lines extend from the display region to the non-display region along a first direction, at least one of the plurality of signal lines comprises a first trace in the display region and a second trace in the non-display region, the second trace comprises at least two sub-traces disconnected from each other, a sub-trace, close to the display region, of the at least two sub-traces of the second trace is directly connected with the first trace, and every two adjacent sub-traces of the second trace are electrically connected with each other through one of the at least one transfer electrode.

For example, in the array substrate provided by at least one embodiment of the present disclosure, the first trace and the second trace are in a same layer with respect to the base substrate.

For example, in the array substrate provided by at least one embodiment of the present disclosure, the plurality of signal lines are in parallel along a second direction, and the first direction intersects with the second direction; and the first sub-trace comprises a portion as a fan-out trace, and an extension direction of the portion as the fan-out trace is a third direction, and the third direction intersects with both the first direction and the second direction.

For example, in the array substrate provided by at least one embodiment of the present disclosure, the first sub-trace is connected with one of the at least one transfer electrode through at least one first via hole, and the second sub-trace is connected with the one of the at least one transfer electrode through at least one second via hole.

For example, in the array substrate provided by at least one embodiment of the present disclosure, a position of a projection of the at least one first via hole on a board surface of the base substrate is at an end, away from the display region, of the first sub-trace; and a position of a projection of the at least one second via hole on a board surface of the base substrate is at an end, close to the display region, of the second sub-trace.

For example, in the array substrate provided by at least one embodiment of the present disclosure, the plurality of signal lines are a plurality of gate lines, the array substrate comprises a gate metal layer, at least one insulation layer and a conductive layer that are sequentially on the base substrate, the gate metal layer comprises the plurality of gate lines, the conductive layer comprises the at least one transfer electrode, and both the at least one first via hole and the at least one second via hole penetrate through the at least one insulation layer; and a projection of the at least one transfer electrode on a board surface of the base substrate at least partially overlaps with a projection of the at least one first via hole on the board surface of the base substrate, and a projection of the at least one transfer electrode on the board surface of the base substrate at least partially overlaps with a projection of the at least one second via hole on the board surface of the array substrate.

For example, the array substrate provided by at least one embodiment of the present disclosure further comprises a thin film transistor on the base substrate, the thin film transistor comprises a gate electrode, a gate insulation layer, an active layer, a source electrode, and a drain electrode, and the gate insulation layer is between the gate electrode and the active layer; and the gate metal layer further comprises the gate electrode, the conductive layer further comprises the source electrode and the drain electrode, and the at least one insulation layer comprises the gate insulation layer.

For example, the array substrate provided by at least one embodiment of the present disclosure further comprises a thin film transistor, a passivation layer and a pixel electrode that are on the base substrate, the thin film transistor comprises a gate electrode, a gate insulation layer, an active layer, a source electrode, and a drain electrode, and the gate insulation layer is between the gate electrode and the active layer, the passivation layer is on a side, away from the base substrate, of the thin film transistor and comprises a via hole exposing one selected from a group consisting of the source electrode and the drain electrode, the pixel electrode is on a side, away from the base substrate, of the passivation layer and is electrically connected with one selected from the group consisting of the source electrode and the drain electrode through the via hole, the gate metal layer further comprises the gate electrode, and the conductive layer further comprises the pixel electrode, the pixel electrode is in the display region, and the at least one insulation layer comprises a stack of the gate insulation layer and the passivation layer.

At least one embodiment of the present disclosure further provides a display device, the display device comprises the array substrate according to any one of the embodiments of the present disclosure, an opposite substrate and a flexible circuit board, the opposite substrate is aligned with and bonded with the array substrate, and the flexible circuit board is bonded with the array substrate to be electrically connected with the array substrate.

At least one embodiment of the present disclosure further provides a motherboard, comprising at least one array substrate unit, the array substrate unit has a display region and a non-display region, and comprises a base substrate, and a plurality of signal line, at least one transfer electrode and a test line that are on the base substrate, the plurality of signal lines extend from the display region to the non-display region along a first direction, at least one of the plurality of signal lines comprises a first trace in the display region and a second trace in the non-display region, the second trace comprises at least two sub-traces disconnected from each other, a sub-trace, close to the display region, of the at least two sub-traces of the second trace is directly connected with the first trace, every two adjacent sub-traces of the second trace are electrically connected with each other through one of the at least one transfer electrode, the test line is in the non-display region along a second direction, the test line is connected with a sub-trace, away from the display region, of the at least two sub-traces of the second trace, and the first direction intersects with the second direction.

For example, in the motherboard provided by at least one embodiment of the present disclosure, the second trace comprises a first sub-trace and a second sub-trace that are disconnected from each other, the first sub-trace is directly connected with the first trace, and the second sub-trace is directly connected with the test line.

For example, in the motherboard provided by at least one embodiment of the present disclosure, a distance between an end, away from the display region, of the first sub-trace and an end, close to the display region, of the second sub-trace is a first distance, and the first distance is larger than or equal to 5 microns and less than or equal to 12 microns.

For example, in the motherboard provided by at least one embodiment of the present disclosure, a distance of one of the at least one transfer electrode in a direction perpendicular to an extension direction of the first sub-trace is a second distance, and the second distance is larger than or equal to 35 microns and less than or equal to 45 microns.

For example, in the motherboard provided by at least one embodiment of the present disclosure, the first sub-trace is connected with one of the at least one transfer electrode through at least one first via hole, and the second sub-trace is connected with the one of the at least one transfer electrode through at least one second via hole.

For example, in the motherboard provided by at least one embodiment of the present disclosure, a position of a projection of the at least one first via hole on a board surface of the base substrate is at an end, away from the display region, of the first sub-trace; and a position of a projection of the at least one second via hole on the board surface of the base substrate is at an end, close to the display region, of the second sub-trace.

For example, in the motherboard provided by at least one embodiment of the present disclosure, the plurality of signal lines are a plurality of gate lines, the array substrate comprises a gate metal layer, at least one insulation layer and a conductive layer that are sequentially on the base substrate, the gate metal layer comprises the plurality of gate lines, the conductive layer comprises the at least one transfer electrode, and both the at least one first via hole and the at least one second via hole penetrate through the at least one insulation layer; and a projection of the at least one transfer electrode on a board surface of the base substrate at least partially overlaps with a projection of the at least one first via hole on the board surface of the base substrate, and a projection of the at least one transfer electrode on the board surface of the base substrate at least partially overlaps with a projection of the at least one second via hole on the board surface of the array substrate.

At least one embodiment of the present disclosure further provides a manufacturing method of an array substrate, the array substrate has a display region and a non-display region, and the method comprises: providing a base substrate, and forming a plurality of signal lines and at least one transfer electrode on the base substrate; the plurality of signal lines extend from the display region to the non-display region along a first direction, at least one of the plurality of signal lines comprises a first trace in the display region and a second trace in the non-display region, the second trace comprises at least two sub-traces disconnected from each other, a sub-trace, close to the display region, of the at least two sub-traces of the second trace is directly connected with the first trace, and every two adjacent sub-traces of the second trace are electrically connected with each other through one of the at least one transfer electrode.

For example, in the manufacturing method provided by at least one embodiment of the present disclosure, forming the plurality of signal lines and the at least one transfer electrode on the base substrate comprises: sequentially forming a gate metal layer, at least one insulation layer and a conductive layer on the base substrate; the plurality of signal lines are a plurality of gate lines, the gate metal layer comprises the plurality of gate lines, the conductive layer comprises the at least one transfer electrode, the at least one insulation layer comprises at least one first via hole and at least one second via hole, the first sub-trace is connected with one of the at least one transfer electrode through at least one first via hole, and the second sub-trace is connected with the one of the at least one transfer electrode through at least one second via hole.

For example, the manufacturing method provided by at least one embodiment of the present disclosure further comprises: forming a test line arranged along a second direction in the non-display region; the test line is connected with a sub-trace, away from the display region, of the at least two sub-traces of the second trace, and the first direction intersects with the second direction.

For example, the manufacturing method provided by at least one embodiment of the present disclosure further comprises: cutting off a part, where the test line is located, from the base substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electric connection, directly or indirectly.

Figure 1A:
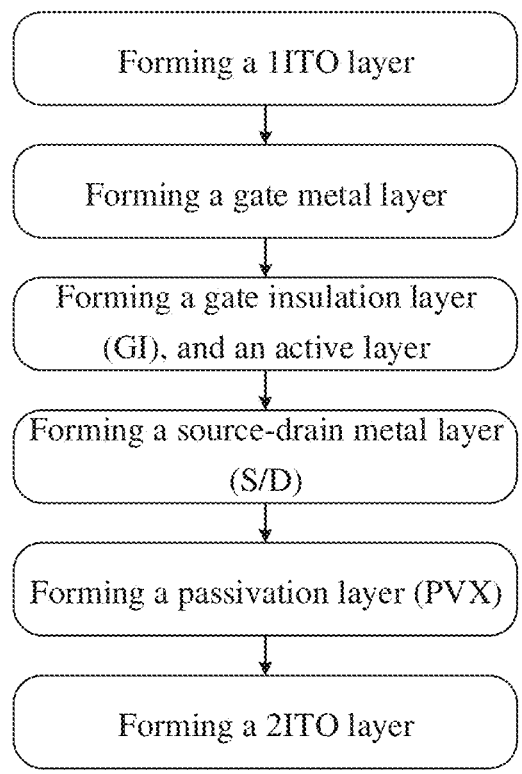
FIG. 1A is a schematic diagram of a process flow for manufacturing an array substrate.
Figure 1B:
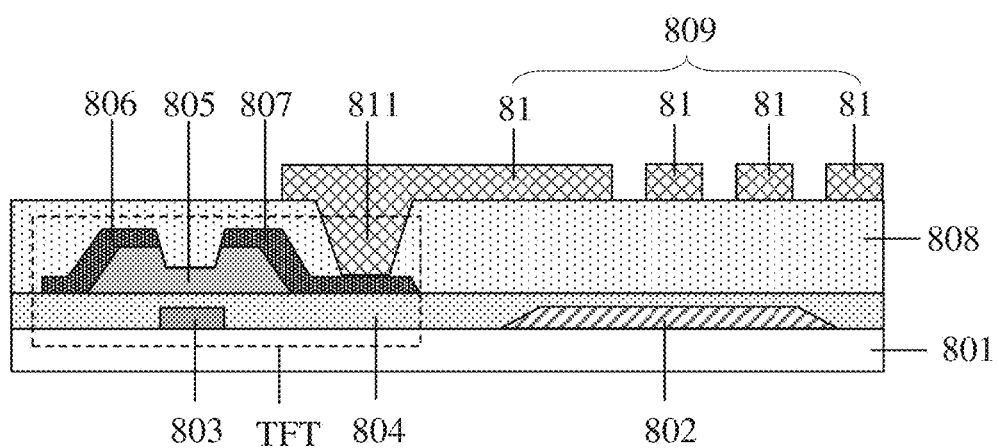
FIG. 1B is a schematic cross-sectional diagram of the array substrate manufactured by the process flow illustrated in FIG. 1A.

FIG. 1A illustrates a process flow for manufacturing an array substrate, and FIG. 1B is a schematic cross-sectional diagram of an array substrate manufactured by the process flow in FIG. 1A. For example, the array substrate can be used to combine with an opposite substrate to form a thin film transistor liquid crystal display (TFT-LCD).

The following describes six process steps illustrated in FIG. 1A with reference to the schematic cross-sectional diagram of the array substrate illustrated in FIG. 1B.

First, a uniform indium tin oxide (ITO) film is formed on a surface of a base substrate 801 (for example, a glass substrate) by a magnetron sputter process; then, steps of glue coating, exposure, development and etching (for example, wet etching) are sequentially performed to etch off the ITO film which is not protected by photoresist, and finally, the remaining photoresist on the base substrate 801 is stripped and cleaned to form an ITO layer. For example, the ITO layer can be called a first ITO (1ITO) layer. For example, a common electrode (VCOM) 802 can be formed in the 1ITO layer.

Then, for example, a uniform metal film is formed on the base substrate by a magnetron sputter process; then steps of glue coating, exposure, development and etching (for example, wet etching) are sequentially performed to etch off the metal film which is not protected by photoresist, and finally, the remaining photoresist on the base substrate is stripped and cleaned to form a gate metal layer. For example, the gate metal layer includes a gate electrode 803 for a thin film transistor TFT and a gate line (GL) connected with the gate electrode 803, and a common electrode line electrically connected with the common electrode 802 can further be formed.

Then, a gate insulation layer (GI) 804 is formed by a deposition process, and for example, silicon nitride is used as a material of the gate insulation layer 804, and an active layer 805 is formed by a deposition process. Three layers which are a SiNx layer, a a-Si layer and an n+a-Si layer are respectively deposited on the base substrate 801 by a process of plasma enhanced chemical vapor deposition (PECVD); then steps of glue coating, exposure, development and etching (for example, dry etching) are sequentially performed to etch off the three layers which are not protected by photoresist, and finally, the remaining photoresist on the base substrate 801 is stripped and cleaned, thereby forming the gate insulation layer 804 and the active layer 805 of the thin film transistor TFT.

Then, for example, a uniform metal film is formed on the base substrate 801 by a magnetron sputter process. Then steps of glue coating, exposure, development and etching (for example, wet etching) are sequentially performed to etch off the metal film which is not protected by photoresist, and finally, the remaining photoresist on the base substrate 801 is stripped and cleaned, thereby forming a source-drain metal layer (S/D). For example, the source-drain metal layer includes a source electrode 806 and a drain electrode 807 that are for the thin film transistor TFT, and a data line (DL) connected to the thin film transistor TFT.

Then, for example, a uniform insulation layer is formed on the base substrate 801 by a PECVD process. Then steps of glue coating, exposure, development and etching (for example, dry etching) are sequentially performed to etch off the insulation layer which is not protected by photoresist, and finally, the remaining photoresist on the base substrate 801 is stripped and cleaned to form a passivation layer (PVX) 808. For example, the passivation layer 808 is patterned to form a via hole 811 exposing the drain electrode 807, and the passivation layer 808 further provides a flat surface on a side away from the base substrate thereof, which acts as a planarization layer.

Then, for example, a uniform ITO film is formed on the surface of the base substrate 801 by a magnetron sputter process. Then, steps of glue coating, exposure, development and etching (for example, wet etching) are sequentially performed to etch off the ITO film which is not protected by photoresist, and finally, the remaining photoresist on the base substrate 801 is stripped and cleaned to form an ITO layer, and for example, this ITO layer is called a second ITO (2ITO) layer. For example, the pixel electrode 809 can be formed in the 2ITO layer. The pixel electrode 809 is electrically connected to the drain electrode 807 through the via hole 811.

For example, the pixel electrode 809 is a slit electrode and the common electrode 802 is a plate electrode. The pixel electrode 809 includes a plurality of portions 81 that are arranged at intervals, and a slit is formed between two adjacent portions of the plurality of portions 81. A multi-dimensional electric field can be formed by an electric field generated at an edge of the slit electrode and an electric field generated between the slit electrode and the plate electrode. In the case where the array substrate is used to manufacture a liquid crystal panel, all oriented liquid crystal molecules both between the slit electrodes and right above the electrodes can rotate, thereby improving the working efficiency of liquid crystal and increasing the light transmission efficiency.

Figure 1C:
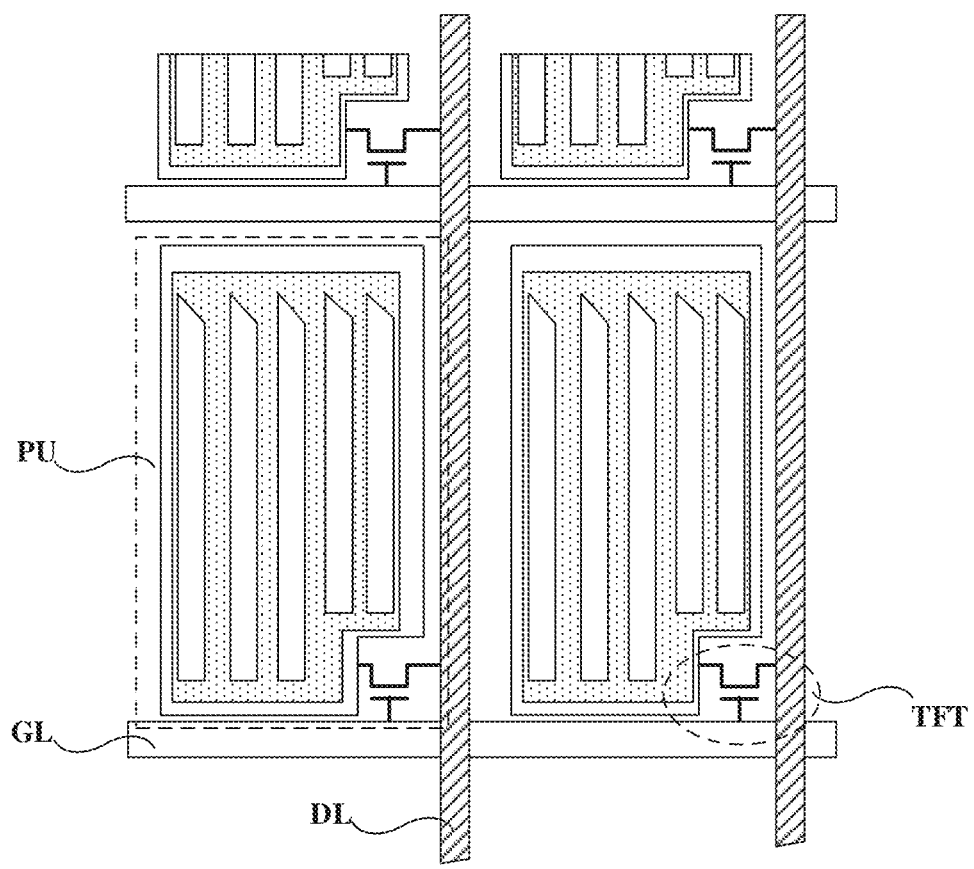
FIG. 1C is a top diagram of the array substrate manufactured by the process flow illustrated in FIG. 1A.

FIG. 1C is a top diagram of the array substrate manufactured by the process flow illustrated in FIG. 1A. As illustrated in FIG. 1C, the array substrate includes a plurality of pixel units PU arranged in an array, and each pixel unit PU includes a thin film transistor TFT. For example, the gate electrode 803 of the TFT is electrically connected to the gate line GL to receive a scanning signal, the source electrode 806 of the TFT is electrically connected to the data line DL to receive a data signal, and the drain electrode 807 is electrically connected to the pixel electrode 809.

Figure 1D:
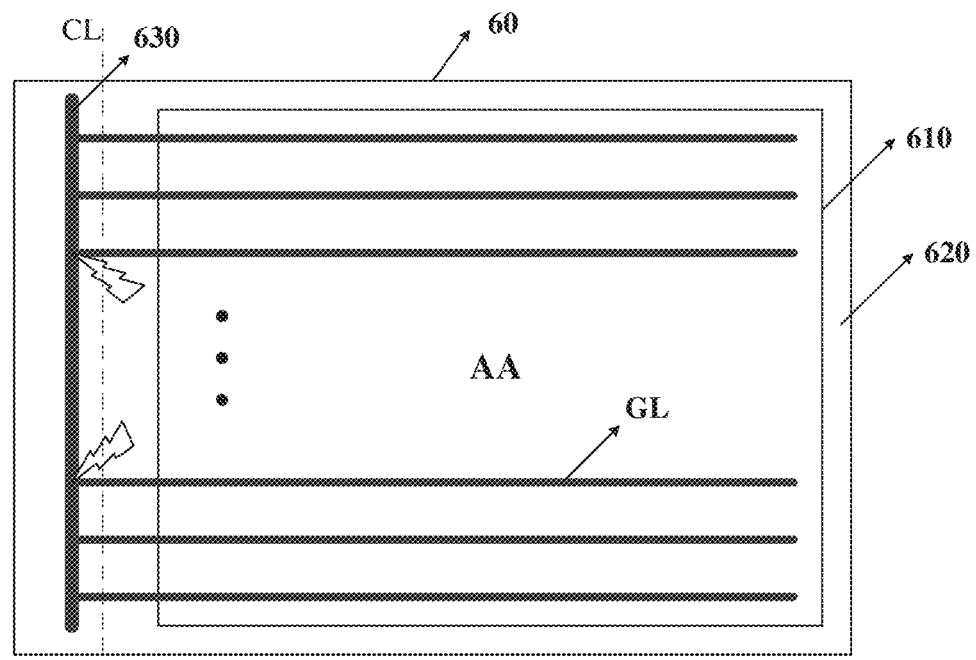
FIG. 1D is a schematic diagram of an array substrate.

For example, FIG. 1D is a schematic diagram of a motherboard of the array substrate manufactured by the above process flow. The motherboard includes one or more array substrate units, and these array substrate units are cut and separated to obtain an array substrate for a subsequent cell process. Therefore, after the preparation process is completed but before the cutting process, each array substrate unit have the same structure as the array substrate except for the part that is cut away. As illustrated in FIG. 1D, the array substrate unit 60 includes a display region 610 (also called an effective display region AA) and a non-display region 620 (also called a peripheral region) surrounding the display region 610.

As illustrated in FIG. 1D, a plurality of gate lines GL are provided in the display region 610 of the array substrate unit 60, for example, the gate lines GL are configured to provide scanning signals to the gate electrodes of the thin film transistors in a plurality of pixel units.

In the above-mentioned process flow for manufacturing the array substrate, in order to realize quality monitoring, after the manufacture of array substrate is completed, an array test process needs to be performed to check possible defects of the array substrate, for example, gate line breakage and gate line short can both be detected. In order to perform the above array test process, it is required that all the gate lines GL in the display region 610 are led out to the non-display region 620, and a test line 630 (also called shorting bar) is used to be shorting connected with the gate lines GL. In the array test process, only one voltage (for example, a positive voltage) needs to be applied to the test line 630. After the array test process is completed, for example, in a cutting process before a subsequent cell process, the cutting process is performed along a predetermined cutting line CL, and the above-mentioned test line 630 for detection is cut off, so that the normal operation of the finally manufactured display panel is not affected.

As illustrated in FIG. 1D, in the array substrate obtained after the above-mentioned cutting process, the gate line GL connected to the test line 630 is also cut accordingly, so that an end surface of the gate line GL in the non-display region is flush with an edge of the array substrate (obtained by the cutting process).

However, the inventors found that the following problems may exist in the process flow for manufacturing the array substrate. For example, as can be seen from the above, the material of the gate insulation layer (GI) is silicon nitride, which can be formed by chemical reaction of $NH_3$, $SiH_4$ and $N_2$ in a plasma environment. The plasma environment contains a large number of electrons, and a plasma source is located above the array substrate. Because the gate metal layer is directly exposed to the plasma environment, a large amount of charges are easily accumulated on the gate line GL in the display region 610. These charges are conducted along the gate line GL, and when it is conducted to the connection between the gate line GL and the test line 630 (for example, the trace at the connection is at a right angle), the arching phenomenon easily occurs at the bending because of tip discharge, which may burn the gate line GL thus to cause defects such as breakage.

At least one embodiment of the present disclosure provides an array substrate, and the array substrate has a display region and a non-display region, and includes a base substrate, and a plurality of signal lines and at least one transfer electrode that are on the base substrate. The plurality of signal lines extend from the display region to the non-display region along a first direction, at least one of the plurality of signal lines includes a first trace in the display region and a second trace in the non-display region, the second trace includes at least two sub-traces disconnected from each other, a sub-trace, close to the display region, of the at least two sub-traces of the second trace is directly connected with the first trace, and every two adjacent sub-traces of the second trace are electrically connected with each other through one of the at least one transfer electrode.

At least one embodiment of the present disclosure further provides a display panel including the above array substrate.

At least one embodiment of the present disclosure further provides a manufacturing method corresponding to the above array substrate.

In the array substrate provided by the embodiment of the present disclosure, because the signal lines are designed to be disconnected, during the manufacturing process of the array substrate, the charges accumulated on the signal lines in the display region cannot be conducted to other traces such as a test line, so that arcing can be avoided at the connection between the signal lines and other traces in the array substrate, and defects such as breakage of the signal lines can further be avoided.

Some specific embodiments are described below, the present disclosure is not limited to these embodiments, and the features included in these embodiments can be combined with each other without contradiction.

Figure 2:
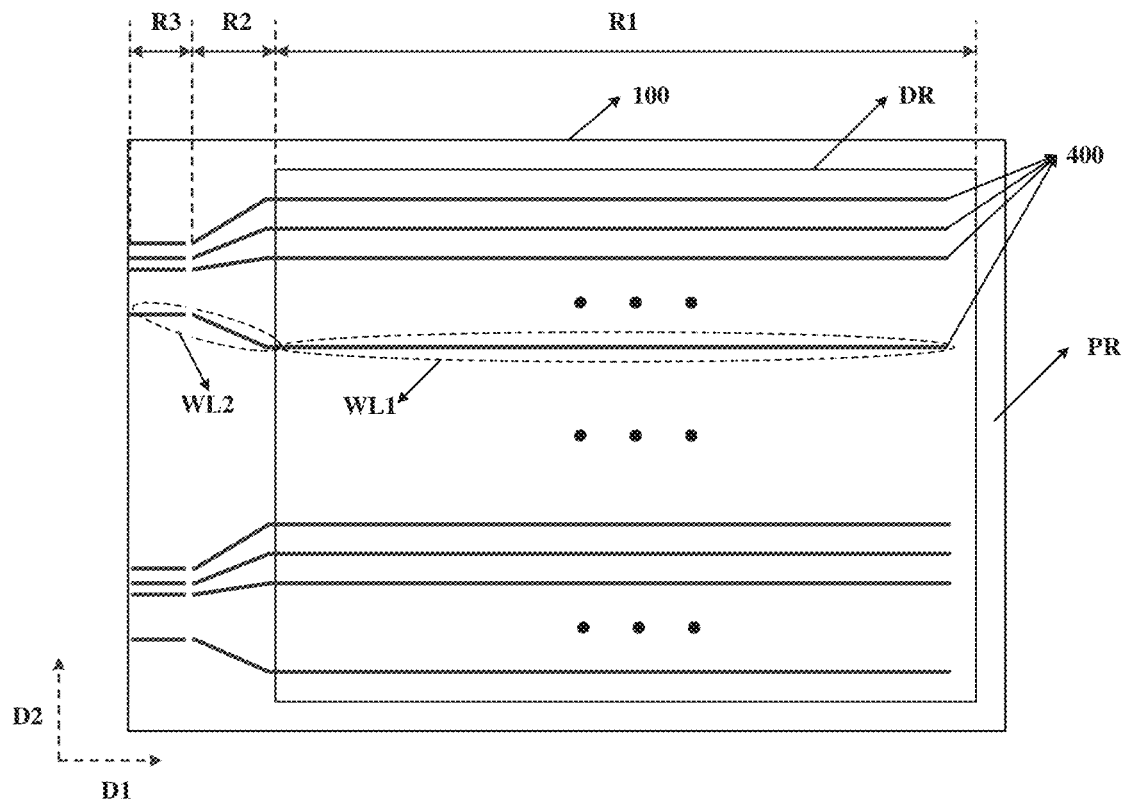
FIG. 2 is a schematic diagram of an array substrate provided by at least one embodiment of the present disclosure.

At least one embodiment of the present disclosure provides an array substrate 100. As illustrated in FIG. 2, the array substrate 100 has a display region DR and a non-display region PR, and includes a base substrate and a plurality of signal lines 400 on the base substrate. The display region DR includes a plurality of pixel units arranged in an array, and each pixel unit includes a thin film transistor TFT, a pixel electrode, a common electrode, and the like. It should be noted that each of the signal lines 400 in the embodiment of the present disclosure may be a gate line, for example, the gate line is configured to provide a scanning signal to the gate electrode of the thin film transistor in the display region DR. The embodiments of the present disclosure include but are not limited to this, and the signal lines 400 in the array substrate 100 provided by the embodiments of the present disclosure may also be signal lines providing other electrical signals.

As illustrated in FIG. 2, the plurality of signal lines 400 extend from the display region DR to the non-display region PR along a first direction D1, and at least one of the signal lines 400 includes a first trace WL1 in the display region DR and a second trace WL2 in the non-display region PR.

For example, taking each of the signal lines 400 as a gate line as an example, a gate driving circuit or a driving chip provides a scanning signal to the gate electrode of the thin film transistor in the display region DR through the gate line; in order not to occupy the space of the display region DR, it is required that the gate driving circuit or the driving chip is generally arranged in the non-display region PR, so the gate line is required to extend from the display region DR to the non-display region PR. In addition, the gate lines need to be electrically connected with the above-mentioned gate driving circuit or driving chip, extending to the non-display region PR, and the gate driving circuit or the driving chip needs to provide a connection port or a connection pin for each gate line. Therefore, in order to reduce the area occupied by the gate driving circuit or the driving chip, a part (some) of the gate lines need to be set as fan-out traces, so that the plurality of gate lines can be gathered together and then electrically connected with the gate driving circuit or the driving chip.

It should be noted that the plurality of signal lines 400 (for example, gate lines) in the array substrate 100 illustrated in FIG. 2 are divided into two groups when performing as fan-out traces, and the embodiments of the present disclosure include but are not limited to this, and the plurality of signal lines 400 can not be grouped or divided into more groups when performing as fan-out traces.

As described above, the signal line 400 needs to be provided with a fan-out trace, as illustrated in FIG. 2. in at least one embodiment of the present disclosure, three regions which the signal line 400 passes through when extending are respectively called a first region R1 (i.e., the display region DR), a second region R2 (the region where the fan-out traces are provided), and a third region R3 (the region connected with other signal traces). In addition, a portion of the signal line 400 in the first region R1 (i.e., the display region DR) is referred to as a first trace WL1, and a portion of the signal line 400 in the second region R2 and the third region R3 is referred to as a second trace WL2.

The array substrate is obtained by cutting a motherboard (refer to FIG. 5), so that an end surface of the signal line 400 in the third region R3 is flush with an edge of the array substrate (obtained by the cutting process).

For example, the second trace WL2 includes at least two sub-traces SL disconnected from each other, and the sub-trace SL, close to the display region DR, of the at least two sub-traces SL of the second trace WL2 is directly connected with the first trace WL1.

For example, on the base substrate, at least two disconnected sub-traces SL included in the second trace WL2 are located in a same layer, that is, in a same layer. In the embodiments of the present disclosure, the term "in a same layer" means that two structural layers are in the same layer and formed of the same material in a stacked structure, so that in the manufacturing process of the array substrate, the two structural layers can be formed of the same material layer, and the required patterns and structures can be formed by one same patterning process.

Figure 3A:
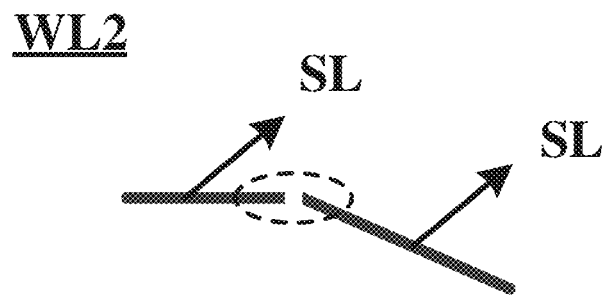
FIG. 3A is a schematic diagram of a second trace provided by at least one embodiment of the present disclosure.
Figure 3B:
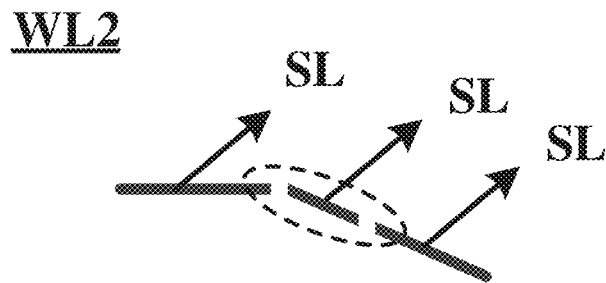
FIG. 3B is a schematic diagram of another second trace provided by at least one embodiment of the present disclosure.

For example, in some embodiments of the present disclosure, as illustrated in FIG. 3A, the second trace WL2 includes two sub-traces SL disconnected from each other, and the sub-trace SL, close to the display region DR, of the two sub-traces SL is directly connected with the first trace WL1; for another example, in other embodiments of the present disclosure, as illustrated in FIG. 3B, the second trace WL2 includes three sub-traces SL disconnected from each other, and the sub-trace SL, close to the display region DR, of the three sub-traces SL is directly connected with the first trace WL1.

It should be noted that FIG. 3A and FIG. 3B schematically show that the second trace WL2 includes two sub-traces SL disconnected from each other and three sub-traces SL disconnected from each other, respectively, and the embodiments of the present disclosure include but are not limited to this. For example, the second trace WL2 can also include four or more sub-traces SL disconnected from each other, and the embodiments of the present disclosure do not limit the number of sub-traces SL included in the second trace WL2.

Figure 4A:
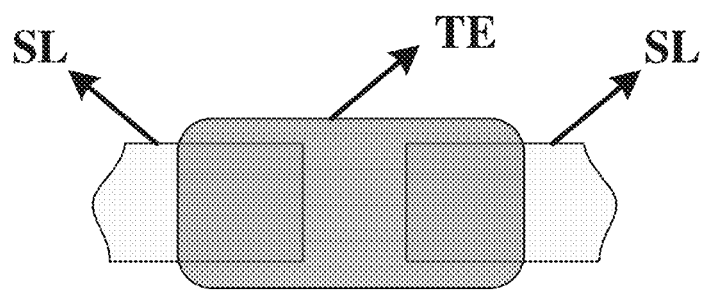
FIG. 4A is an enlarged schematic diagram corresponding to the part in the dotted ellipse in FIG. 3A.
Figure 4B:
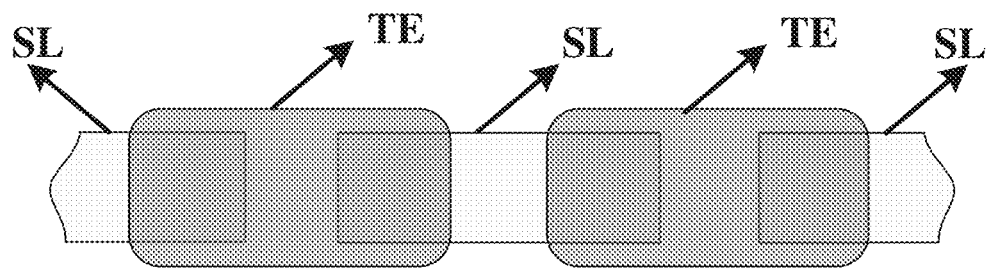
FIG. 4B is an enlarged schematic diagram corresponding to the part in the dotted ellipse in FIG. 3B.

For example, the array substrate 100 further includes at least one transfer electrode on the base substrate, and every two adjacent sub-traces SL of the second traces WL2 are electrically connected with each other through the transfer electrode (one of the at least one transfer electrode). It should be noted that the transfer electrode is not illustrated in FIG. 2, FIG. 3A and FIG. 3B. In order to clearly illustrate the transfer electrode, the part in the dashed ellipse in FIG. 3A is enlarged and illustrated in FIG. 4A, and the part in the dashed ellipse in FIG. 3B is enlarged and illustrated in FIG. 4B. As illustrated in FIG. 4A, the two sub-traces SL are electrically connected to each other through the transfer electrode TE. As illustrated in FIG. 4B, every two adjacent sub-traces SL are electrically connected to each other through the transfer electrode TE, and three sub-traces SL disconnected from each other need to be correspondingly provided with two transfer electrodes TE.

In the array substrate 100 provided by the embodiments of the present disclosure, because the signal lines 400 are designed to be disconnected, the charges accumulated on the signal lines 400 in the display region DR during the manufacturing process of the array substrate 100 cannot be conducted to other traces, such as the test line described below, so that arcing at the connection between the signal lines 400 and other traces in the array substrate 100 can be avoided, and defects such as breakage of the signal lines 400 can further be avoided.

Figure 5:
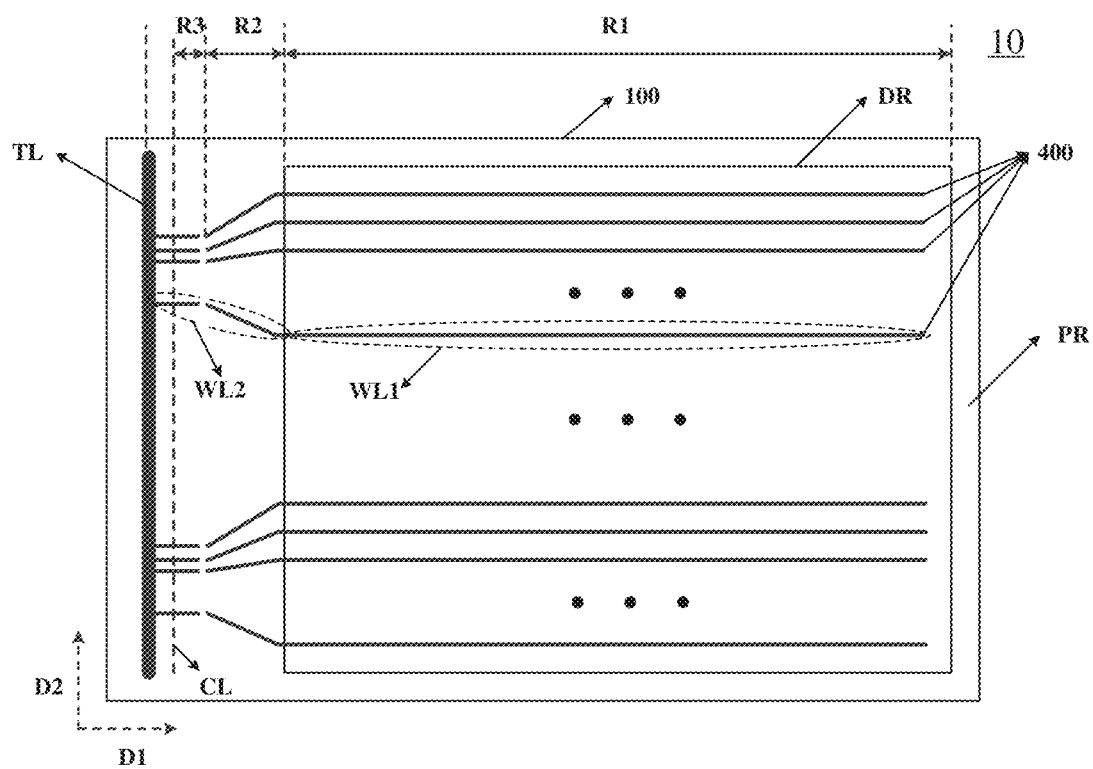
FIG. 5 is a schematic diagram of a motherboard used for an array substrate provided by at least one embodiment of the present disclosure.

As illustrated in FIG. 5, some embodiments of the present disclosure provide a motherboard 10 for the array substrate 100, and the motherboard 10 includes at least one array substrate unit, and each array substrate unit is used to form the array substrate 100 after being cut. In the case where the motherboard includes a plurality of the array substrate units, the array substrate units are arranged in an array including a plurality of rows and a plurality of columns, for example. Although FIG. 5 shows only one array substrate unit, the embodiments of the present disclosure are not limited thereto. Therefore, after the manufacturing process is completed but before the cutting process, each array substrate unit has the same structure as the array substrate except the part that is cut off, so the following description of the same structure of the array substrate and the array substrate unit can be referred to each other.

Compared with the array substrate 100 obtained after the cutting process, each array substrate unit further includes a test line TL, which is arranged in the non-display region PR along the second direction D2. For example, the test line TL is connected to the sub-trace SL at one end, away from the display region DR, of each of the plurality of signal lines 400, and the first direction D1 intersects with the second direction D2. For example, in some embodiments of the present disclosure, the second direction D2 is perpendicular to the first direction D1. For example, in the case where the signal line 400 is the gate line, the test line TL can be a test line TL for detecting the gate line in the above-described array test process. For example, during the array test process, only one voltage (for example, a positive voltage) is required to be applied to the test line TL.

It should be noted that after the above-described array test process is completed, the part where the test line TL is located needs to be cut off from the array substrate unit corresponding to the array substrate 100, and for example, the test line TL is cut off along the cutting line CL illustrated in FIG. 5. For example, in the cutting process of the cell stage, the test line TL for detection is cut off so that the normal operation of the finally manufactured display panel is not affected.

Because of the cutting process, an end surface of the signal line 400 in the third region R3 is flush with the edge (obtained by the cutting process) of the array substrate.

It should be noted that, as illustrated in FIG. 5, the disconnection point of the two disconnected sub-traces included in the second trace WL2 is located at the junction of the second region R2 and the third region R3. The embodiments of the present disclosure include but are not limited to this case, and the disconnection point of the second trace WL2 can also in the second region R2 or the third region R3.

Figure 6A:
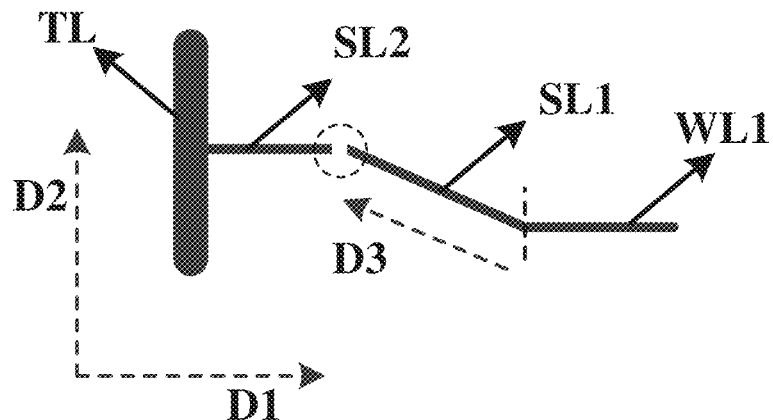
FIG. 6A is a schematic diagram of a first sub-trace and a second sub-trace provided by at least one embodiment of the present disclosure.
Figure 6B:
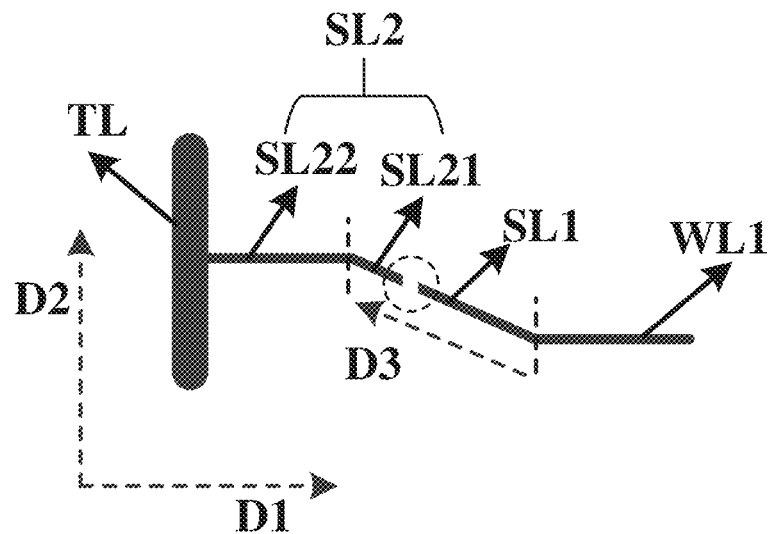
FIG. 6B is a schematic diagram of another first sub-trace and another second sub-trace provided by at least one embodiment of the present disclosure.
Figure 6C:
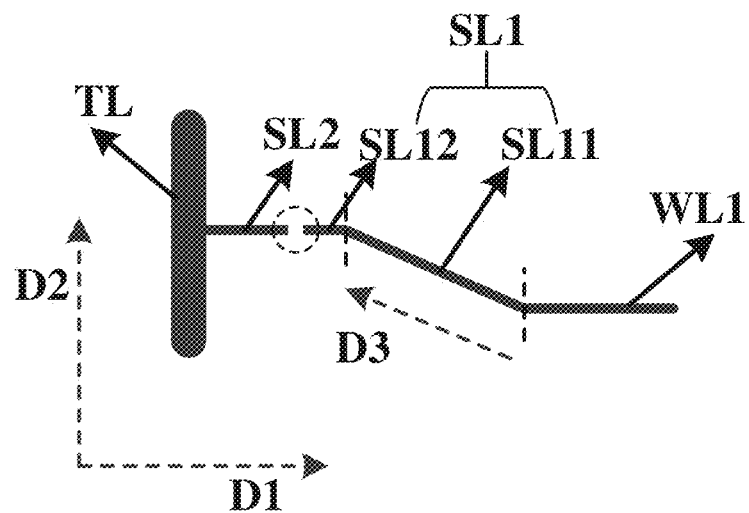
FIG. 6C is a schematic diagram of further another first sub-trace and further another second sub-trace provided by at least one embodiment of the present disclosure.

Some embodiments of the second trace WL2 are described with reference to FIG. 6A, FIG. 6B and FIG. 6C. It should be noted that only a part of the first trace WL1 and a part of the test line TL are illustrated in FIG. 6A, FIG. 6B and FIG. 6C. In addition, the transfer electrode TE is not illustrated in all of FIG. 5 to FIG. 6C.

For example, in some embodiments of the present disclosure, as illustrated in FIG. 6A, FIG. 6B and FIG. 6C, the second trace WL2 includes a first sub-trace SL1 and a second sub-trace SL2 that are disconnected from each other, the first sub-trace SL1 is directly connected to the first trace WL1, and the second sub-trace SL2 is directly connected to the test line TL. It should be noted that, in FIG. 6A, FIG. 6B and FIG. 6C, the dotted circle marks the disconnection between the first sub-trace SL1 and the second sub-trace SL2 that are included in the second trace WL2.

For example, as illustrated in FIG. 6A, in some embodiments, the first sub-trace SL1 is a fan-out trace, and the extension direction of the first sub-trace SL1 is a third direction D3, which intersects with both the first direction D1 and the second direction D2, and the extension direction of the second sub-trace SL2 is parallel to the first direction D1. As described above, the fan-out trace is configured to gather a plurality of signal lines 400 together, so the direction of the fan-out trace intersects with the first direction D1. In the embodiment illustrated in FIG. 6A, the disconnection point between the first sub-trace SL1 and the second sub-trace SL2 included in the second trace WL2 is located at the junction of the second region R2 and the third region R3.

For example, as illustrated in FIG. 6B, in some embodiments, the first sub-trace SL1 is a fan-out trace, and the extension direction of the first sub-trace SL1 is the third direction D3, which intersects with both the first direction D1 and the second direction D2. The second sub-trace SL2 includes a first portion SL21 extending along the third direction D3 and a second portion SL22 extending along the first direction D1, and the first portion SL21 is directly connected with the second portion SL22. In the embodiment illustrated in FIG. 6B, the disconnection point between the first sub-trace SL1 and the second sub-trace SL2 included in the second trace WL2 is in the second region R2.

For example, as illustrated in FIG. 6C, in some embodiments, the first sub-trace SL1 includes a first portion SL11 extending along the third direction D3 and a second portion SL12 extending along the first direction D1, the third direction D3 intersects with both the first direction D1 and the second direction D2, and the first portion SL11 is a fan-out trace, and the extension direction of the second sub-trace SL2 is parallel to the first direction D1. In the embodiment illustrated in FIG. 6C, the disconnection point between the first sub-trace SL1 and the second sub-trace SL2 included in the second trace WL2 is in the third region R3.

Figure 7:
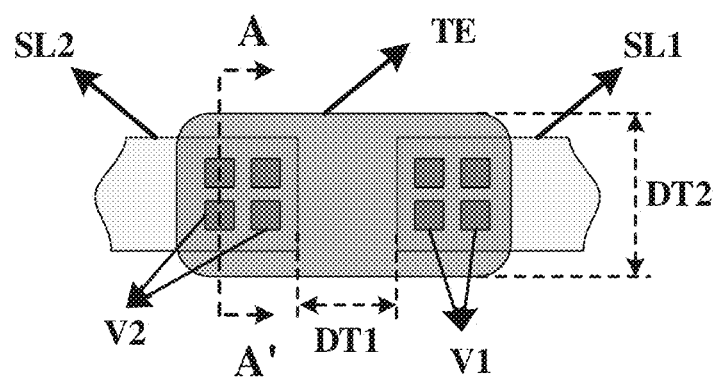
FIG. 7 is a schematic diagram of first via holes and second via holes provided by at least one embodiment of the present disclosure.

The enlarged part in the dotted circle in FIG. 6A (or FIG. 6B or FIG. 6C) and the transfer electrode TE are illustrated in FIG. 7. The embodiment in which two disconnected sub-traces (for example, the first sub-trace SL1 and the second sub-trace SL2) are electrically connected with each other through the transfer electrode TE is described below with reference to FIG. 7.

For example, as illustrated in FIG. 7, in some embodiments of the present disclosure, the first sub-trace SL1 is connected with the transfer electrode TE through at least one first via hole V1, and the second sub-trace SL2 is connected with the transfer electrode TE through at least one second via hole V2.

For example, a position of a projection of the first via hole V1 on a board surface of the base substrate 101 is located at an end, away from the display region DR, of the first sub-trace SL1; and a position of a projection of the second via hole V2 on the board surface of the base substrate 101 is located at an end, close to the display region DR, of the second sub-trace SL2.

FIG. 7 shows four first via holes V1 distributed in a shape of the Chinese character "田". In addition, FIG. 7 shows four second via holes V2 distributed in a shape of the Chinese character "田".

It should be noted that the embodiments of the present disclosure do not limit the number and distribution positions of the first via holes V1, as long as the first sub-trace SL1 is electrically connected with the transfer electrode TE. In addition, the embodiments of the present disclosure do not limit the number and distribution positions of the second via holes V2, as long as the second sub-traces SL2 can be electrically connected with the transfer electrodes TE. The following embodiments are the same in this aspect and are not be described again.

For example, as illustrated in FIG. 7, the distance between the end, away from the display region DR, of the first sub-trace SL1 and the end, close to the display region DR, of the second sub-trace SL2 is referred to as a first distance DT1.

Considering the process problem, in order to reduce the risk of etching failure, the first distance DT1 is required to be larger than a certain value; in addition, in order to reduce the increase in the resistance of the signal line 400 caused by the transfer electrode TE, the first distance DT1 is required to be smaller than a certain value. For example, in some embodiments of the present disclosure, the first distance DT1 is larger than or equal to 5 microns (μm) and less than or equal to 12 microns (μm).

For example, in some other embodiments of the present disclosure, the first distance DT1 is larger than or equal to 7 microns and less than or equal to 10 microns.

For example, as illustrated in FIG. 7, a distance of the transfer electrode TE in a direction perpendicular to the extension direction of the first sub-trace SL1 is a second distance DT2. Because the resistivity of the transfer electrode TE may be large, in order to reduce the increase in the resistance of the signal line 400 caused by the transfer electrode TE, for example, the second distance DT2 is larger than or equal to 35 microns and less than or equal to 45 microns. For example, the second distance DT2 is approximately equal to 40 microns. For example, in the case where the second distance DT2 is equal to 40 microns, the resistance of the transfer electrode TE in a turn-on state is less than 20 ohms (0).

Figure 8A:
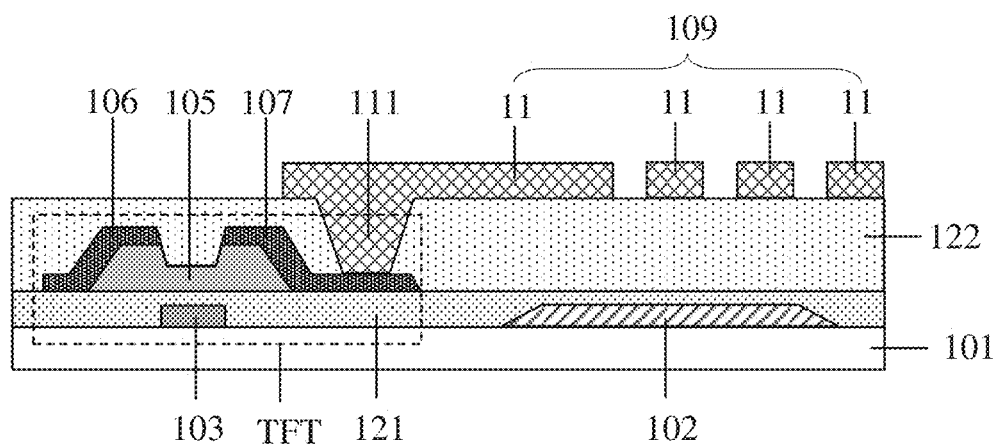
FIG. 8A is a schematic cross-sectional diagram of a display region of an array substrate provided by at least one embodiment of the present disclosure.
Figure 8B:
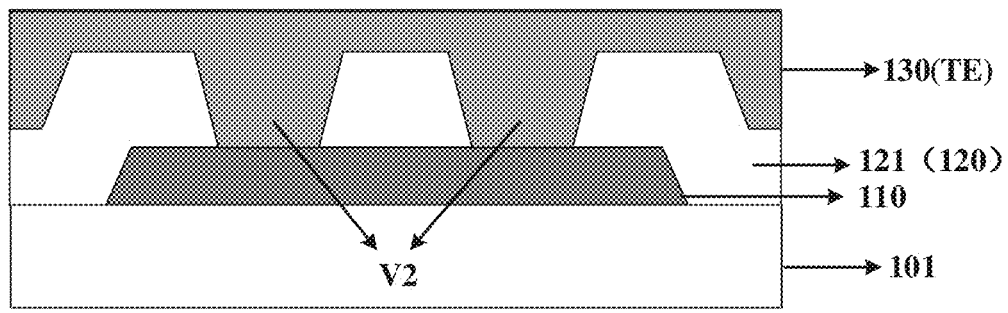
FIG. 8B is an example of a cross-sectional diagram taken along the dotted line AN in FIG. 7.
Figure 8C:
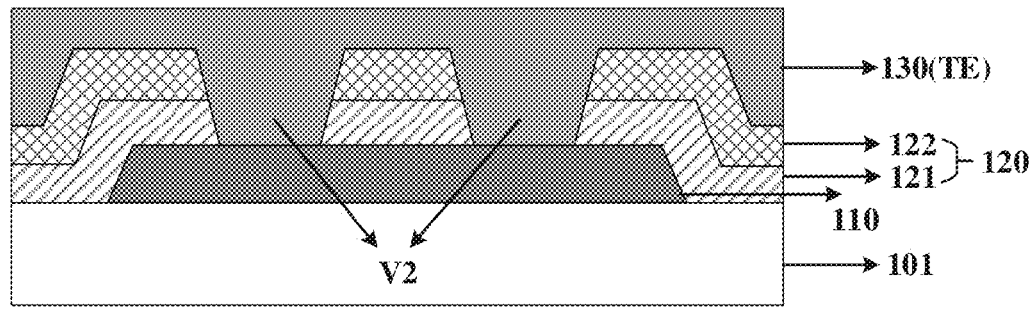
FIG. 8C is another example of a cross-sectional diagram taken along the dotted line AN in FIG. 7.

FIG. 8A is a schematic cross-sectional diagram of the display region of the array substrate provided by at least one embodiment of the present disclosure; FIG. 8B is an example of a cross-sectional diagram taken along the dotted line AA' in FIG. 7; FIG. 8C is another example of a cross-sectional diagram taken along the dotted line AA' in FIG. 7. The schematic cross-sectional diagram illustrated in FIG. 8A corresponds to, for example, the array substrate illustrated in FIG. 2 or the array substrate motherboard illustrated in FIG. 5.

In the following, the relationship between the various layers in the array substrate 100 is described with reference to FIG. 7 and FIG. 8A. It should be noted that description takes the case that each signal line 400 is a gate line as an example in the following embodiments.

The array substrate includes a plurality of pixel units arranged in an array, and each the pixel unit includes a thin film transistor TFT. As illustrated in FIG. 8A, the thin film transistor TFT includes a gate electrode 103, a gate insulation layer 121, an active layer 105, a source electrode 106 and a drain electrode 107 that are on the base substrate 101, and the gate insulation layer 121 is between the gate electrode 103 and the active layer 105. The pixel unit further includes a common electrode 102, a pixel electrode 109 and a passivation layer 122. The common electrode 102 is on the base substrate and covered by the gate insulation layer 121. The passivation layer 122 is on a side, away from the substrate 101, of the thin film transistor TFT, and includes a via hole 111 exposing one selected from a group consisting of the source electrode 106 and the drain electrode 107. In the example illustrated in FIG. 8A, the drain electrode 107 is exposed by the via hole 111. The pixel electrode 109 is arrange on a side, away from the base substrate, of the passivation layer 122 and is electrically connected with the drain electrode 107 through the via hole 111.

The gate electrode 103 of the thin film transistor TFT is electrically connected with the gate line to receive the scanning signal, and the source electrode 106 of the thin film transistor TFT is connected with the data line to receive the data signal.

The pixel electrode 109 is a slit electrode, and the common electrode 102 is a plate electrode. The pixel electrode 109 includes a plurality of portions 11 arranged at intervals, and a slit is formed between two adjacent portions of the plurality of portions 11. A multi-dimensional electric field can be formed by the electric field generated at the edge of the slit electrode and the electric field generated between the slit electrode and the plate electrode.

The material of the active layer may include polysilicon or oxide semiconductor (for example, indium gallium zinc oxide). The material of the gate electrode and the material of the gate line may include a metal material or an alloy material, such as a single metal layer or a multi-layer structure formed by molybdenum, aluminum and titanium, and for example, the multi-layer structure is a structure consisting of stacked multi-metal films (such as a three-layer metal structure consisting of stacked titanium film, aluminum film and titanium film (Al/Ti/Al)). The material of the source electrode, the drain electrode and the data line may include a metal material or an alloy material, for example, a single metal layer or a multi-layer structure formed by molybdenum, aluminum and titanium, and for example, the multi-layer structure is a structure consisting of stacked multi-metal films (such as a three-layer metal structure consisting of stacked titanium film, aluminum film and titanium film (Al/Ti/Al)). The embodiments of the present disclosure do not specifically limit the material of each functional layer. The material of the pixel electrode and the common electrode may include a transparent conductive material such as indium tin oxide (ITO).

In some embodiments of the present disclosure, the array substrate 100 includes a gate metal layer 110, at least one insulation layer 120, and a conductive layer 130, which are sequentially arranged on the base substrate. The gate metal layer 110 includes a plurality of gate lines and a plurality of gate electrodes, the conductive layer 130 includes at least one transfer electrode TE, and both the first via holes V1 and the second via holes V2 penetrate through the at least one insulation layer 120.

In the example illustrated in FIG. 8B, the at least one insulation layer 120 is a gate insulation layer 121, and the conductive layer 130 is a source-drain electrode layer, that is, the transfer electrode TE is in the same layer as the source electrode 106 and the drain electrode 107 of the thin film transistor. In this example, the transfer electrode TE is made of, for example, a metal material.

In the example illustrated in FIG. 8C, the at least one insulation layer 120 is a stacked layer consisting of the gate insulation layer 121 and the passivation layer 122, and the conductive layer 130 may be a pixel electrode layer, that is, the transfer electrode TE is in the same layer as the pixel electrode in the display region. In this example, the transfer electrode TE is made of, for example, an ITO material (for example, the 21TO layer illustrated in FIG. 1).

A projection of the transfer electrode TE on the board surface of the base substrate 101 at least partially overlap with a projection of the at least one first via hole V1 on the board surface of the base substrate 101, and the projection of the transfer electrode TE on the board surface of the base substrate 101 at least partially overlap with a projection of the at least one second via hole V2 on the board surface of the base substrate 101. It should be noted that the electrode pattern of the transfer electrode TE may be formed by a photolithography process when forming the conductive layer 130. For example, the transfer electrode TE does not need to be too large, and the projection of the transfer electrode TE on the board surface of the base substrate 101 is only required to cover the first via hole V1 and the second via hole V2.

At least one embodiment of the present disclosure provides a manufacturing method of an array substrate, and the array substrate has a display region and a non-display region. The method comprises: providing a base substrate, and forming a plurality of signal lines and at least one transfer electrode on the base substrate. The plurality of signal lines extend from the display region to the non-display region along a first direction, at least one of the plurality of signal lines includes a first trace in the display region and a second trace in the non-display region, the second trace includes at least two sub-traces disconnected from each other, a sub-trace, close to the display region, of the at least two sub-traces of the second trace is directly connected with the first trace, and every two adjacent sub-traces of the second trace are electrically connected with each other through the transfer electrode.

Figure 9:
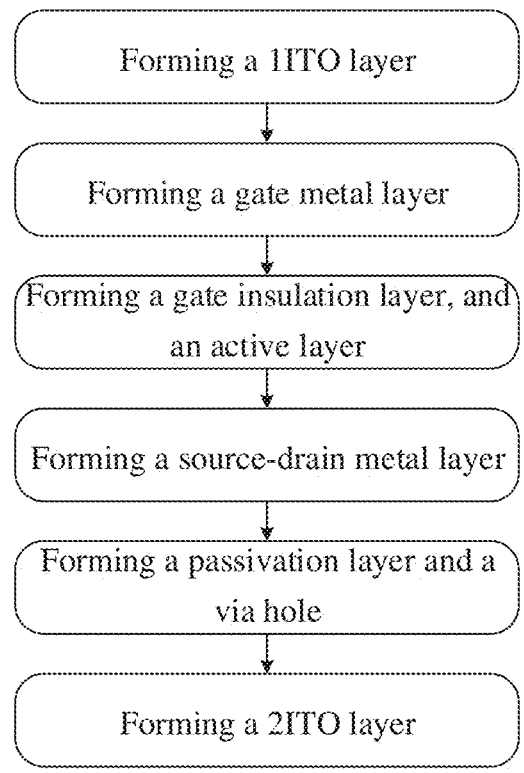
FIG. 9 is a schematic diagram of a process flow for manufacturing an array substrate provided by at least one embodiment of the present disclosure.

FIG. 9 is a schematic diagram of a process flow for manufacturing an array substrate provided by at least one embodiment of the present disclosure, for example the embodiment corresponds to the embodiment illustrated in FIG. 8C. For example, the array substrate is formed by a motherboard, the motherboard includes a plurality of array substrate units, and each array substrate unit is used for cutting to form an individual array substrate.

First, a film of uniform transparent conductive material (for example, an indium tin oxide (ITO) film) is formed on the surface of the base substrate 101 (for example, a glass substrate) by a magnetron sputter process; then, steps of glue coating, exposure, development and etching (for example, wet etching) are sequentially performed to etch off the ITO film which is not protected by photoresist, and finally, the remaining photoresist on the base substrate 101 is stripped and cleaned to form an ITO layer. For example, this ITO layer is called a first ITO (1ITO) layer. For example, a common electrode (VCOM) 102 can be formed in the 1ITO layer.

Then, for example, a uniform metal film is formed on the base substrate by a magnetron sputter process; then steps of glue coating, exposure, development and etching (for example, wet etching) are sequentially performed to etch off the metal film which is not protected by photoresist, and finally, the remaining photoresist on the base substrate is stripped and cleaned to form a gate metal layer. For example, the gate metal layer includes a gate electrode 103 for a thin film transistor TFT and a gate line connected with the gate electrode 103, and a common electrode line electrically connected with the common electrode 102 can further be formed. The gate line includes a first trace WL1 in the display region and a second trace WL2 in the non-display region, and the second trace WL2 includes at least two sub-traces SL disconnected from each other. In addition, the gate metal layer further includes a test line TL in the non-display region, and the test line TL is electrically connected with the one, which is away from the display region, of the at least two sub-traces SL included in the second trace WL2.

Then, for example, a gate insulation layer 121 is formed by a deposition process, for example, the material of the gate insulation layer 121 includes at least one selected from a group consisting of silicon nitride, silicon oxide, silicon oxynitride, etc., and an active layer 105 is formed by a deposition process. For example, three layers which are a SiNx layer, a a-Si layer and an n+a-Si layer are respectively deposited on the base substrate 101 by a process of plasma enhanced chemical vapor deposition (PECVD); then steps of glue coating, exposure, development and etching (for example, dry etching) are sequentially performed to etch off the three layers which are not protected by photoresist, and finally, the remaining photoresist on the base substrate 101 is stripped and cleaned, thereby forming the gate insulation layer 121 and the active layer 105 of the thin film transistor TFT.

Then, for example, a uniform metal film is formed on the base substrate 101 by a magnetron sputter process. Then, steps of glue coating, exposure, development and etching (for example, wet etching) are sequentially performed to etch off the metal film which is not protected by photoresist, and finally, the remaining photoresist on the base substrate 101 is stripped and cleaned, thereby forming a source-drain metal layer (S/D). For example, the source-drain metal layer includes a source electrode 106 and a drain electrode 107 for the thin film transistor TFT, and a data line connected to the thin film transistor TFT.

Then, for example, a uniform insulation layer is formed on the base substrate 101 by a PECVD process. Then, steps of glue coating, exposure, development and etching (for example, dry etching) are sequentially performed to etch off the insulation layer which is not protected by photoresist, and finally, the remaining photoresist on the base substrate 101 is stripped and cleaned to form a passivation layer (PVX) 122. For example, the passivation layer 122 is patterned to form a via hole 111 exposing the drain electrode 107 and to form a first via hole V1 and a second via hole V2 which respectively exposes the two sub-traces SL of the second trace. The via hole 111 penetrates through the passivation layer 122, while the first via hole V1 and the second via hole V2 penetrates through the stack layer 120 stacked by the passivation layer 122 and the gate insulation layer 121. The passivation layer 122 further provides a flat surface on the side away from the substrate thereof, and plays the role of a planarization layer.

Then, a film of uniform transparent conductive material (for example, an ITO film) is formed on the surface of the base substrate 101 by a magnetron sputter process; then steps of glue coating, exposure, development and etching (for example, wet etching) are sequentially performed to etch off the ITO film which is not protected by photoresist, and finally, the remaining photoresist on the base substrate 101 is stripped and cleaned to form an ITO layer, for example, this ITO layer is called a second ITO (2ITO) layer. For example, the pixel electrode 109 and the transfer electrode TE are formed in the 2ITO layer. The pixel electrode 109 is electrically connected to the drain electrode 107 through the via hole 111. The transfer electrode TE electrically connects the disconnected sub-traces SL of the second trace WL2 through the first via V1 and the second via V2.

The above process flow for manufacturing the array substrate is not limited to the above steps, and can be modified accordingly. For example, the step of forming the common electrode can be performed after forming the gate metal layer and before forming the gate insulation layer, or the step of forming the common electrode can be performed after forming the source-drain metal layer and before forming the passivation layer. The embodiments of the present disclosure are not limited in this aspect.

For another example, an example of at least one embodiment of the present disclosure provides a manufacturing method of the array substrate 100. Referring to FIG. 8B and FIG. 8C, the manufacturing method includes: providing a base substrate 101, and sequentially forming a gate metal layer 110, at least one insulation layer 120, and a conductive layer 130 on the base substrate 101.

For example, the array substrate is formed by a motherboard, the motherboard includes a plurality of array substrate units, and each array substrate unit, which is used for forming the array substrate 100, has a display region DR and a non-display region PR. The gate metal layer 110 includes a plurality of gate lines, and further includes a gate electrode of a thin film transistor, a common electrode line, a test line TL, and the like. The plurality of gate lines extend from the display region DR to the non-display region PR along the first direction D1; and at least one of the plurality of gate lines includes a first trace WL1 in the display region DR and a second trace WL2 in the non-display region PR. The conductive layer 130 includes at least one transfer electrode TE, and in one example, the conductive layer 130 further includes a source electrode and a drain electrode of the thin film transistor, and a data line, or in another example, the conductive layer 130 further includes a pixel electrode. The second trace WL2 includes at least two sub-traces SL disconnected with each other, a sub-trace SL, close to display region DR, of the second trace WL2 is directly connected with the first trace WL1, and every two adjacent sub-traces SL of the second trace WL2 are electrically connected with each other through the transfer electrode TE.

For example, in the manufacturing method provided by some embodiments of the present disclosure, the gate metal layer 110 further includes a test line TL arranged in the non-display region PR along the second direction D2, the test line TL is connected with the sub-trace SL at an end, away from the display region DR, of the plurality of gate lines, and the first direction D1 intersects with the second direction D2.

For example, in the manufacturing method provided by some embodiments of the present disclosure, the second trace WL2 includes a first sub-trace SL1 and a second sub-trace SL2 disconnected with each other, the first sub-trace SL1 is directly connected with the first trace WL1 and is in direct contact with the first trace WL1, and the second sub-trace SL2 is directly connected with the test line TL and is in direct contact with the test line TL.

For example, in the manufacturing method provided by some embodiments of the present disclosure, the first sub-trace SL1 is connected with the transfer electrode TE through at least one first via hole V1, and the second sub-trace SL2 is connected with the transfer electrode TE through at least one second via hole V2. Both the first via hole V1 and the second via hole V2 penetrate through the at least one insulation layer 120, a projection of the transfer electrode TE on the surface of the base substrate 101 at least partially overlaps with a projection of the at least one first via hole V1 on the surface of the base substrate 101, and a projection of the transfer electrode TE on the surface of the base substrate 101 at least partially overlaps with a projection of the at least one second via hole V2 on the surface of the base substrate 101.

For example, the manufacturing method provided by some embodiments of the present disclosure further includes: cutting off the part, where the test line TL is located, from the base substrate 101 along a predetermined cutting line CL, thereby obtaining an individual array substrate from the array substrate unit. For example, in the cutting process before the cell stage, the test line TL for test is cut off, so that the normal operation of the finally obtained manufactured display panel is not affected. Therefore, the end surface of the gate line GL in the non-display region is flush with the edge of the array substrate (obtained by the cutting process).

It should be noted that, in order to manufacture the array substrate 100, for example, a plurality of array substrates need to be manufactured on a large motherboard first, and then the cutting process is performed to form individual array substrates, and then, for example, the array substrate is performed by a cell process with an opposite substrate to form a display panel. For example, during the cutting process, unnecessary structures for subsequent display, such as the test line TL for test, are cut off.

It should be noted that the detailed description and technical effects of the manufacturing method provided by the embodiments of the present disclosure can refer to the corresponding description of the array substrate 100 in the above embodiments, and are not be described in detail here.

Figure 10:
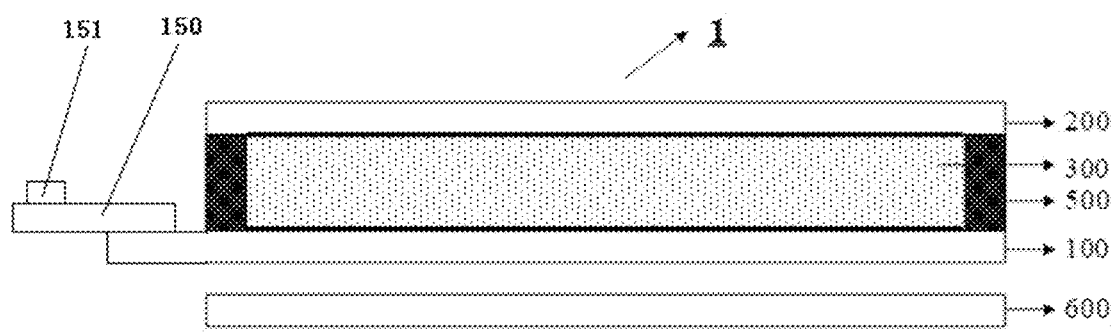
FIG. 10 is a schematic diagram of a display device provided by at least one embodiment of the present disclosure.

At least one embodiment of the present disclosure further provides a display device 1, as illustrated in FIG. 10, the display device 1 includes any one of the array substrates 100 provided by the embodiments of the present disclosure.

For example, the display device 1 is a liquid crystal display device and includes an array substrate 100 and an opposite substrate 200. The array substrate 100 and the opposite substrate 200 are opposite to each other to form a liquid crystal cell (aligned cell), and the liquid crystal cell is filled with a liquid crystal material 300. The opposite substrate 200 is, for example, a color filter substrate. The pixel electrode of each pixel unit of the array substrate 100 is used to apply an electric field to control the degree of rotation of the liquid crystal material 300 to perform a display operation. In some examples, the liquid crystal display device further includes a backlight 600 that provides backlight for the array substrate 100.

The display device 1 further includes a flexible circuit board 150 and an integrated circuit chip 151 on the flexible circuit board 150. The integrated circuit chip 151 can be a control chip or a drive chip, or the like. The mode of that the flexible circuit board includes the chip which is mounted thereon may be called COF (Chip On Film) mode, and the flexible circuit board is electrically connected with a contact pad provided on the array substrate 100 by bonding, thereby being electrically connected with the signal lines on the array substrate.

In different embodiments, for example, the array substrate can be provided with a contact pad electrically connected with the gate line, thereby allowing the gate line to be electrically connected with the flexible circuit board provided with a gate driving circuit (gate driving chip), so that the gate driving circuit can apply a scanning signal to the gate line. For another example, the array substrate can further be provided with a contact pad electrically connected with the data line, thereby allowing the data line to be electrically connected with the flexible circuit board provided with a data driving circuit (data driving chip), so that the data driving circuit can apply a data signal to the data line.

It should be noted that the display device 1 in this embodiment may be any product or component with display function such as a LCD panel, a LCD TV, a display, an OLED panel, an OLED TV, an electronic paper, a mobile phone, a tablet computer, a notebook computer, a digital photo frame, a navigator, etc. The display device 1 may further include other conventional components such as a display panel, which is not limited by the embodiments of the present disclosure.

The technical effects of the display device 1 provided by the embodiments of the present disclosure can be referred to the corresponding descriptions of the array substrate 100 in the above embodiments, and are not be described in detail here.

What are described above is related to the illustrative embodiments of the disclosure only and not limitative to the scope of the disclosure; the scopes of the disclosure are defined by the accompanying claims.

What is claimed is:

1. An array substrate, having a display region and a non-display region, and comprising: a base substrate, and a plurality of signal lines and at least one transfer electrode that are on the base substrate, wherein
the plurality of signal lines extend from the display region to the non-display region along a first direction,
at least one of the plurality of signal lines comprises a first trace in the display region and a second trace in the non-display region,
the second trace comprises at least two sub-traces disconnected from each other, a sub-trace, close to the display region, of the at least two sub-traces of the second trace is directly connected with the first trace, and
every two adjacent sub-traces of the second trace are electrically connected with each other through one of the at least one transfer electrode,
wherein
the at least two sub-traces comprise a first sub-trace and a second sub-trace, and the first sub-trace is the sub-trace directly connected with the first trace, the plurality of signal lines are in parallel along a second direction, and the first direction intersects with the second direction;
the first sub-trace comprises a portion as a fan-out trace, and an extension direction of the portion as the fan-out trace is a third direction, and the third direction intersects with both the first direction and the second direction;
the first sub-trace is connected with one of the at least one transfer electrode through at least one first via hole, and the second sub-trace is connected with the one of the at least one transfer electrode through at least one second via hole;
a position of a projection of the at least one first via hole on a board surface of the base substrate is at an end, away from the display region, of the first sub-trace; and
a position of a projection of the at least one second via hole on a board surface of the base substrate is at an end, close to the display region, of the second sub-trace.

2. The array substrate according to claim 1, wherein the first trace and the second trace are in a same layer with respect to the base substrate.

3. The array substrate according to claim 1, wherein
the plurality of signal lines are a plurality of gate lines,
the array substrate comprises a gate metal layer, at least one insulation layer and a conductive layer that are sequentially on the base substrate, the gate metal layer comprises the plurality of gate lines, the conductive layer comprises the at least one transfer electrode, and both the at least one first via hole and the at least one second via hole penetrate through the at least one insulation layer; and
a projection of the at least one transfer electrode on the board surface of the base substrate at least partially overlaps with the projection of the at least one first via hole on the board surface of the base substrate, and the projection of the at least one transfer electrode on the board surface of the base substrate at least partially overlaps with the projection of the at least one second via hole on the board surface of the array substrate.

4. The array substrate according to claim 3, wherein the array substrate further comprises a thin film transistor on the base substrate,
the thin film transistor comprises a gate electrode, a gate insulation layer, an active layer, a source electrode, and a drain electrode, and the gate insulation layer is between the gate electrode and the active layer; and
the gate metal layer further comprises the gate electrode, the conductive layer further comprises the source electrode and the drain electrode, and the at least one insulation layer comprises the gate insulation layer.

5. The array substrate according to claim 3, wherein the array substrate further comprises a thin film transistor, a passivation layer and a pixel electrode that are on the base substrate,
the thin film transistor comprises a gate electrode, a gate insulation layer, an active layer, a source electrode, and a drain electrode, and the gate insulation layer is between the gate electrode and the active layer,
the passivation layer is on a side, away from the base substrate, of the thin film transistor and comprises a via hole exposing one selected from a group consisting of the source electrode and the drain electrode,
the pixel electrode is on a side, away from the base substrate, of the passivation layer and is electrically connected with one selected from the group consisting of the source electrode and the drain electrode through the via hole,
the gate metal layer further comprises the gate electrode, and the conductive layer further comprises the pixel electrode, the pixel electrode is in the display region, and the at least one insulation layer comprises a stack of the gate insulation layer and the passivation layer.

6. A display device, comprising:
the array substrate according to claim 1,
an opposite substrate aligned with and bonded with the array substrate, and
a flexible circuit board bonded with the array substrate to be electrically connected with the array substrate.

7. A motherboard, comprising at least one array substrate unit, wherein the array substrate unit has a display region and a non-display region, and comprises a base substrate, and a plurality of signal line, at least one transfer electrode and a test line that are on the base substrate,
the plurality of signal lines extend from the display region to the non-display region along a first direction,
at least one of the plurality of signal lines comprises a first trace in the display region and a second trace in the non-display region,
the second trace comprises at least two sub-traces disconnected from each other, a sub-trace, close to the display region, of the at least two sub-traces of the second trace is directly connected with the first trace,
every two adjacent sub-traces of the second trace are electrically connected with each other through one of the at least one transfer electrode,
the test line is in the non-display region along a second direction,
the test line is connected with a sub-trace, away from the display region, of the at least two sub-traces of the second trace, and the first direction intersects with the second direction.

8. The motherboard according to claim 7, wherein the at least two sub-traces comprise a first sub-trace and a second sub-trace, the first sub-trace is the sub-trace directly connected with the first trace, and the second sub-trace is directly connected with the test line.

9. The motherboard according to claim 8, wherein
a distance between an end, away from the display region, of the first sub-trace and an end, close to the display region, of the second sub-trace is a first distance, and the first distance is larger than or equal to 5 microns and less than or equal to 12 microns.

10. The motherboard according to claim 9, wherein
a distance of one of the at least one transfer electrode in a direction perpendicular to an extension direction of the first sub-trace is a second distance, and the second distance is larger than or equal to 35 microns and less than or equal to 45 microns.

11. The motherboard according to claim 8, wherein
the first sub-trace is connected with one of the at least one transfer electrode through at least one first via hole, and the second sub-trace is connected with the one of the at least one transfer electrode through at least one second via hole.

12. The motherboard according to claim 11, wherein
a position of a projection of the at least one first via hole on a board surface of the base substrate is at an end, away from the display region, of the first sub-trace; and
a position of a projection of the at least one second via hole on the board surface of the base substrate is at an end, close to the display region, of the second sub-trace.

13. The motherboard according to claim 11, wherein
the plurality of signal lines are a plurality of gate lines, the array substrate comprises a gate metal layer, at least one insulation layer and a conductive layer that are sequentially on the base substrate, the gate metal layer comprises the plurality of gate lines, the conductive layer comprises the at least one transfer electrode, and both the at least one first via hole and the at least one second via hole penetrate through the at least one insulation layer; and
a projection of the at least one transfer electrode on a board surface of the base substrate at least partially overlaps with a projection of the at least one first via hole on the board surface of the base substrate, and a projection of the at least one transfer electrode on the board surface of the base substrate at least partially overlaps with a projection of the at least one second via hole on the board surface of the array substrate.

14. A manufacturing method of an array substrate, wherein the array substrate has a display region and a non-display region, and the method comprises:
providing a base substrate,
forming a plurality of signal lines and at least one transfer electrode on the base substrate, wherein the plurality of signal lines extend from the display region to the non-display region along a first direction, at least one of the plurality of signal lines comprises a first trace in the display region and a second trace in the non-display region, the second trace comprises at least two sub-traces disconnected from each other, a sub-trace, close to the display region, of the at least two sub-traces of the second trace is directly connected with the first trace, and every two adjacent sub-traces of the second trace are electrically connected with each other through one of the at least one transfer electrode, and
forming a test line arranged along a second direction in the non-display region, wherein
the test line is connected with a sub-trace, away from the display region, of the at least two sub-traces of the second trace, and the first direction intersects with the second direction.

15. The manufacturing method according to claim 14, wherein forming the plurality of signal lines and the at least one transfer electrode on the base substrate comprises:
sequentially forming a gate metal layer, at least one insulation layer and a conductive layer on the base substrate, wherein
the at least two sub-traces comprise a first sub-trace and a second sub-trace, the first sub-trace is the sub-trace directly connected with the first trace,
the plurality of signal lines are a plurality of gate lines, the gate metal layer comprises the plurality of gate lines,
the conductive layer comprises the at least one transfer electrode,
the at least one insulation layer comprises at least one first via hole and at least one second via hole, the first sub-trace is connected with one of the at least one transfer electrode through at least one first via hole, and the second sub-trace is connected with the one of the at least one transfer electrode through at least one second via hole.

16. The manufacturing method according to claim 14, further comprising:
cutting off a part, where the test line is located, from the base substrate.

* * * * *